(12) United States Patent
Shuto et al.

(10) Patent No.: US 10,267,834 B2
(45) Date of Patent: Apr. 23, 2019

(54) SEMICONDUCTOR DEVICE AND MEASURING METHOD

(71) Applicant: Renesas Electronics Corporation, Tokyo (JP)

(72) Inventors: Makoto Shuto, Tokyo (JP); Kazuyoshi Kawai, Tokyo (JP); Mitsuya Fukazawa, Tokyo (JP); Robert Nolf, Buckinghamshire (GB); Robert Dalby, Buckinghamshire (GB)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/796,995

(22) Filed: Oct. 30, 2017

(65) Prior Publication Data

US 2018/0143229 A1 May 24, 2018

(30) Foreign Application Priority Data

Nov. 22, 2016 (JP) ................................. 2016-226397

(51) Int. Cl.
| | |
|---|---|
| *G01R 21/133* | (2006.01) |
| *G01R 19/252* | (2006.01) |
| *H03G 3/20* | (2006.01) |
| *H03H 17/06* | (2006.01) |
| *H03M 1/38* | (2006.01) |
| *H03M 3/00* | (2006.01) |
| *H03M 1/12* | (2006.01) |

(52) U.S. Cl.
CPC ......... *G01R 21/133* (2013.01); *G01R 19/252* (2013.01); *H03G 3/20* (2013.01); *H03H 17/0621* (2013.01); *H03M 1/1205* (2013.01); *H03M 1/38* (2013.01); *H03M 3/458* (2013.01)

(58) Field of Classification Search
CPC ...... H03G 3/20; G01R 19/252; H03M 1/1205
See application file for complete search history.

(56) References Cited

U.S. PATENT DOCUMENTS

| | | | |
|---|---|---|---|
| 6,418,391 B1 * | 7/2002 | Umezu .............. | G01R 19/2516 702/119 |
| 2005/0138510 A1 * | 6/2005 | Terazawa ......... | G01R 31/31853 714/726 |
| 2009/0108878 A1 * | 4/2009 | Yamada .................... | G06F 1/04 327/39 |

FOREIGN PATENT DOCUMENTS

JP 2014-086892 A 5/2014

OTHER PUBLICATIONS

"Active electrical energy maters. Part 1: Metrological and technical requirements, Part 2: Metrological controls and performance tests", OIML R 46-1/-2, Edition 2012(E), 2012, 72 pages.

* cited by examiner

*Primary Examiner* — Jermele M Hollington
*Assistant Examiner* — Alvaro Fortich
(74) *Attorney, Agent, or Firm* — Sughrue Mion, PLLC

(57) ABSTRACT

There is a need for high-order frequency measurement without greatly increasing consumption currents and chip die sizes. A semiconductor device includes: an electric power measuring portion that performs electric power measurement; a high-order frequency measuring portion that performs high-order frequency measurement; and a clock controller that supplies an electric power measuring portion with a first clock signal at a first sampling frequency and supplies a high-order frequency measuring portion with a second clock signal at a second sampling frequency. The second sampling frequency is higher than the first sampling frequency.

20 Claims, 7 Drawing Sheets

SEMICONDUCTOR DEVICE AND MEASURING METHOD

CROSS-REFERENCE TO RELATED APPLICATIONS

The disclosure of Japanese Patent Application No. 2016-226397 filed on Nov. 22, 2016 including the specification, drawings and abstract is incorporated herein by reference in its entirety.

The present intention relates to a semiconductor device and a measuring method and more particularly to a semiconductor device and its measuring method to measure electric power and high-order frequencies, for example.

There is known a delta-sigma ($\Delta\Sigma$) A/D converter as one form of an AD converter. Patent literature 1 discloses a semiconductor device including a plurality of delta-sigma A/D converters.

There is also known power measurement by using the delta-sigma A/D converter. Power measurement by using the delta-sigma A/D converter may use a sampling frequency of 3.9 kHz for the delta-sigma A/D converter in order to ensure low power consumption, for example.

Presently, the high-order frequency measurement complies with IEC standards in Japan. The IEC standard requires up to fifth-order frequencies. The measurement of up to fifth-order frequencies can use the delta-sigma A/D converter for measurement without greatly increasing consumption currents and chip die sizes. Presently, there is therefore no obstacle to electric power measurement and high-order frequency measurement by using the delta-sigma A/D converter in Japan.

Patent Literature 1: Japanese Unexamined Patent Publication No. 2014-86892

Non-Patent Literature 1: OIML R 46-1/-2 Edition 2012(E)

SUMMARY

However, measurement of frequencies at orders higher than the fifth order is needed to be compliant with the R46 international standard of OIML as the international organization of legal metrology. Non-patent literature discloses the need for measurement of high-order frequencies at up to the 40th order.

A sampling frequency of 235 kHz is needed to measure a 40th-order high-order frequency signal when a sampling frequency is set to 3.9 kHz for the electric power measurement. The inventors therefore found the issue that the configuration of performing the electric power measurement and the high-order frequency measurement by using the delta-sigma A/D converter greatly increases consumption currents and chip die sizes in consideration of compliance with the R46 international standard of OIML.

These and other objects and novel features may be readily ascertained by referring to the following description of the present specification and appended drawings.

According to an embodiment, a semiconductor device includes a clock controller that supplies an electric power measuring portion with a first clock signal using a first sampling frequency and supplies a high-order frequency measuring portion with a second clock signal using a second sampling frequency that is higher than the first sampling frequency.

The first embodiment can perform high-order frequency measurement without greatly increasing consumption currents and chip die sizes.

DETAILED DESCRIPTION

Figure 1:
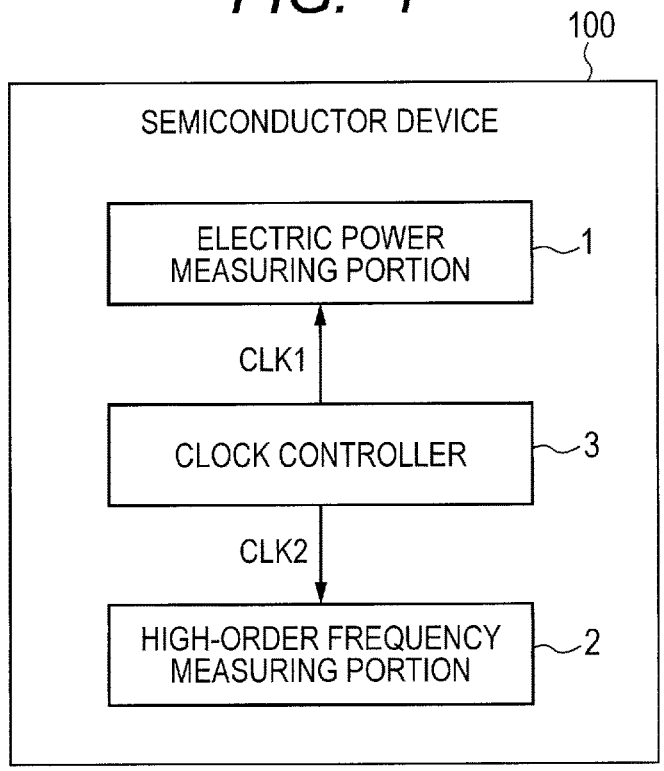
FIG. 1 is a block diagram illustrating an example configuration of a semiconductor device according to an embodiment.

The description below may divide the embodiment into a plurality of sections or embodiments as needed. Unless explicitly specified, the divisions are not unrelated to each other. One provides a modification, an application, a detailed explanation, or a supplementary explanation about all or part of the others. The number of elements (including the number of items, values, quantities, and ranges) referred to in the following embodiment is not limited to a specific value and may be greater or smaller than or equal to the specific value except the number of elements is explicitly specified or is obviously limited to the specific value in principle.

Constituent elements (including operation steps) of the following embodiment are not required unless explicitly specified or obviously required in principle.

The embodiments will be described with reference to the accompanying drawings. The following description and drawings are omitted and simplified as needed in order to clarify the explanation. In the drawings, mutually corresponding elements are designated by the same reference symbols and a duplicate explanation is omitted as needed.

Embodiment Overview

The embodiment overview will be described before proceeding to explanation of embodiments. FIG. 1 is a block diagram illustrating an example configuration of a semiconductor device 100 according to an embodiment. The semiconductor device 100 includes an electric power measuring portion 1, a high-order frequency measuring portion 2, and a clock controller 3.

The electric power measuring portion 1 provides a function block that performs electric power measurement. The electric power measuring portion 1 may or may not include a delta-sigma A/D converter. An AD converter included in the electric power measuring portion 1 may be available in any types such as a cyclic AD converter that satisfies the measurement accuracy (e.g., SNDR (signal-to-noise and distortion ratio)) required for electric power measurement.

The high-order frequency measuring portion 2 provides a function block that performs high-order frequency measurement. The high-order frequency measuring portion 2 may satisfy the measurement accuracy required for the high-order frequency measurement and may be less accurate than the electric power measuring portion 1.

The clock controller 3 provides a function block that supplies the electric power measuring portion 1 with a first clock signal (CLK1) at a first sampling frequency and supplies the high-order frequency measuring portion 2 with a second clock signal (CLK2) at a second sampling frequency. The second sampling frequency is higher than the first sampling frequency. For example, the first sampling frequency may be set to 3.9 kHz and the second sampling frequency may be set to 235 kHz. In this case, the high-order frequency measuring portion 2 can measure a 40th-order high-order frequency signal.

According to the example illustrated in FIG. 1, one clock controller 3 supplies clock signals to the electric power measuring portion 1 and the high-order frequency measuring portion 2, but is not limited thereto. The semiconductor device 100 may include a clock controller for the electric power measuring portion 1 and a clock controller for the high-order frequency measuring portion 2.

Figure 2:
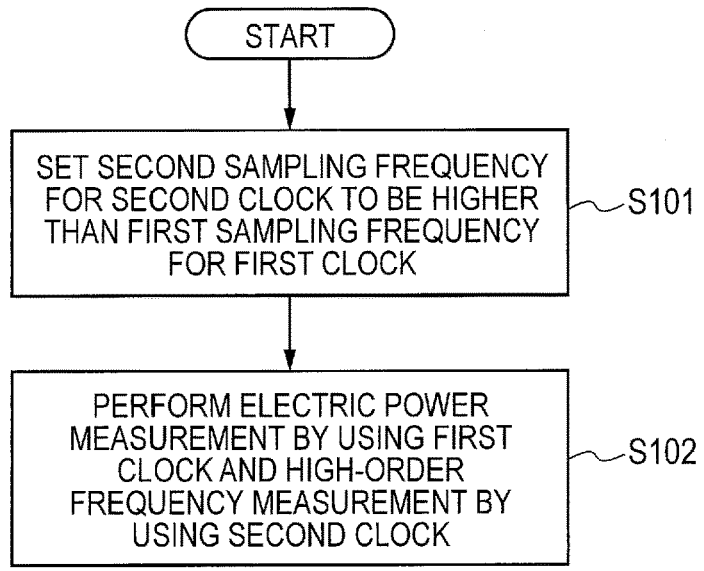
FIG. 2 is a flowchart illustrating example operation of the semiconductor device according to the embodiment.

The description below explains example operation of the semiconductor device 100 according to the embodiment with reference to a flowchart in FIG. 2.

The clock controller 3 sets the second sampling frequency for the second clock to be higher than the first sampling frequency for the first clock (step S101).

The electric power measuring portion 1 performs electric power measurement by using the first clock and the high-order frequency measuring portion 2 performs high-order frequency measurement by using the second clock (step S102).

As above, the semiconductor device 100 according to the embodiment is configured to include the electric power measuring portion 1, the high-order frequency measuring portion 2, and the clock controller 3. The clock controller 3 is configured to supply the electric power measuring portion 1 with the first clock signal at the first sampling frequency and supplies the high-order frequency measuring portion 2 with the second clock signal at the second sampling frequency higher than the first sampling frequency. The semiconductor device 100 can thereby allow the high-order frequency measuring portion 2 configured differently from the electric power measuring portion 1 to perform the high-order frequency measurement by using the second clock signal at the second sampling frequency. Namely, the semiconductor device 100 can perform the high-order frequency measurement without greatly increasing consumption currents and chip die sizes.

First Embodiment

Figure 3:
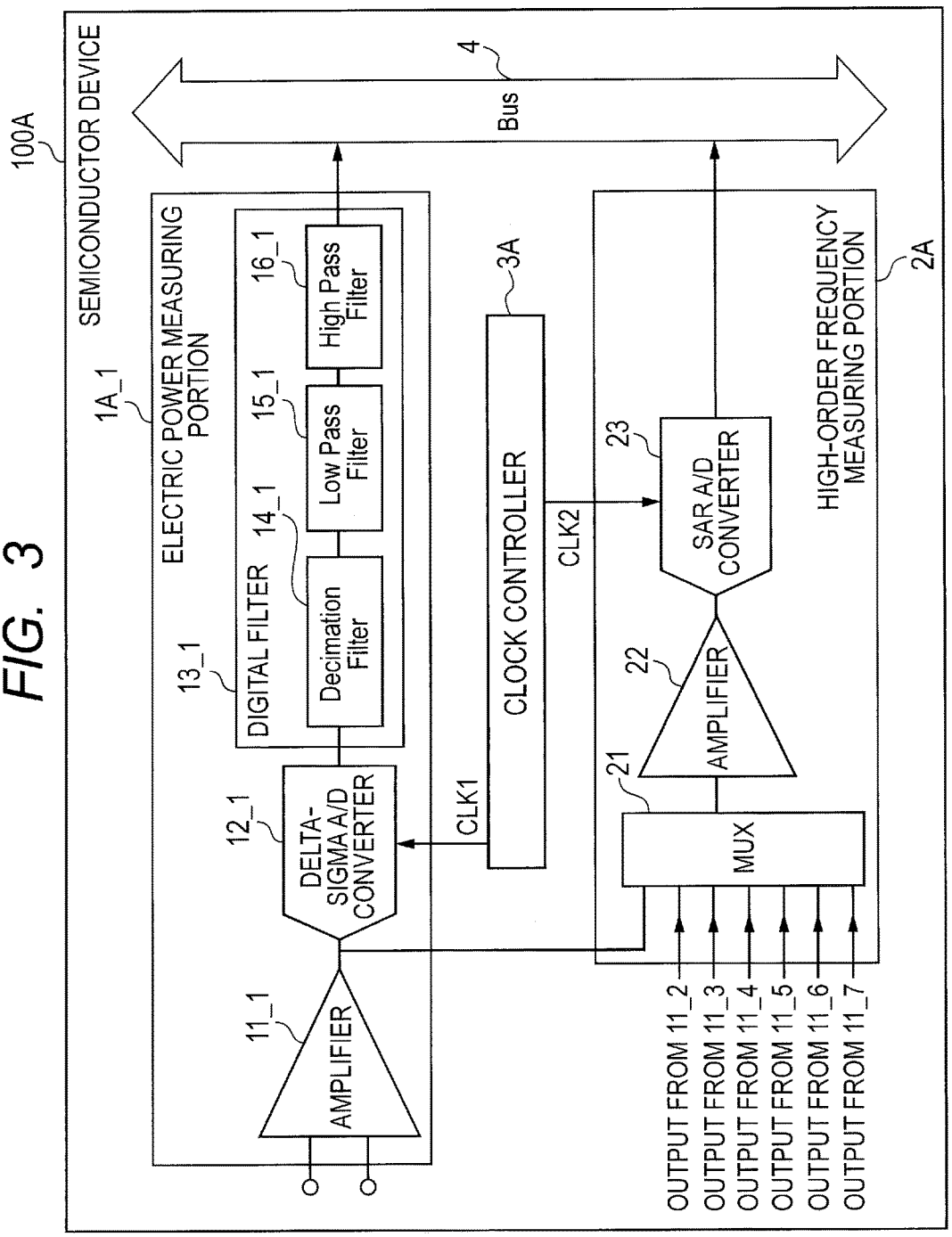
FIG. 3 is a block diagram illustrating an example configuration of a semiconductor device according to a first embodiment.

The first embodiment will be described. FIG. 3 is a block diagram illustrating an example configuration of a semiconductor device 100A according to the first embodiment. The semiconductor device 100A includes an electric power measuring portion 1A_1 through an electric power measuring portion 1A_7, a high-order frequency measuring portion 2A, a clock controller 3A, and a bus 4. The electric power measuring portion 1A_2 through the electric power measuring portion 1A_7 are configured equally to the electric power measuring portion 1A_1 and are omitted from the illustration. The first embodiment explains the example of seven electric power measuring portions 1A (1A_1 through 1A_7) included in the semiconductor device 100A. However, the number of electric power measuring portions 1A included in the semiconductor device 100A is not limited to seven. The number of electric power measuring portions 1A included in the semiconductor device 100A may be two or any larger value.

The clock controller 3A supplies the electric power measuring portion 1A_1 through the electric power measuring portion 1A_7 with the first clock signal at the first sampling frequency. The clock controller 3A supplies the high-order frequency measuring portion 2A with the second clock signal at the second sampling frequency. The following description assumes the first sampling frequency to be set to 3.9 kHz and the second sampling frequency to be set to 235 kHz.

The electric power measuring portion 1A_1 through the electric power measuring portion 1A_7 will be described. The electric power measuring portion 1A_1 through the electric power measuring portion 1A_7 provide function blocks that perform electric power measurement on corresponding channels. Namely, the semiconductor device 100A can perform electric power measurement on seven channels by using the electric power measuring portion 1A_1 through the electric power measuring portion 1A_7.

The electric power measuring portion 1A_1 through the electric power measuring portion 1A_7 are equal to each other except channels to be measured differ. Therefore, only the electric power measuring portion 1A_1 will be described representatively. The electric power measuring portion 1A_1 includes an amplifier 11_1, a delta-sigma A/D converter 12_1, and a digital filter 13_1.

The amplifier 11_1 provides a PGA (Programmable Gain Amplifier) that specifies a gain based on setup information supplied from an unshown control portion, for example. The amplifier 11_1 receives a non-inverted analog input signal from a first channel at a non-inverted input terminal and receives an inverted analog input signal from the first channel at an inverted input terminal to amplify the input signal. The amplifier 11_1 outputs the amplified analog signal from the first channel to the delta-sigma A/D converter 12_1 and the high-order frequency measuring portion 2A.

The delta-sigma A/D converter 12_1 operates on the 3.9 kHz first clock signal received from the clock controller 3A. The delta-sigma A/D converter 12_1 uses the first clock signal to convert the first-channel analog signal received from the amplifier 11_1 into a digital signal. The delta-sigma A/D converter 12_1 outputs the first-channel digital signal to the digital filter 13_1.

The digital filter 13_1 includes a decimation filter 14_1, a low-pass filter 15_1, and a high-pass filter 16_1.

The decimation filter 14_1 performs decimation processing on the first-channel digital signal received from the delta-sigma A/D converter 12_1 to decrease the sampling frequency to an intended frequency. The decimation filter 14_1 outputs the first-channel digital signal with the decreased sampling frequency to the low-pass filter 15_1.

The low-pass filter 15_1 performs low-pass filter processing on the first-channel digital signal received from the decimation filter 14_1 to suppress quantization noise in a high-frequency region. The low-pass filter 15_1 outputs the first-channel digital signal treated by the low-pass filter processing to the high-pass filter 16_1.

The high-pass filter 16_1 performs high-pass filter processing on the first-channel digital signal received from the low-pass filter 15_1 to suppress a signal in a low-frequency region. The high-pass filter 16_1 outputs the first-channel digital signal treated by the high-pass filter processing to the bus 4.

The high-order frequency measuring portion 2A will be described. The high-order frequency measuring portion 2A provides a function block that performs the high-order frequency measurement on channels selected by a multiplexer (MUX) included in the high-order frequency measuring portion 2A while the electric power measuring portion 1A_1 through the electric power measuring portion 1A_7 perform the electric power measurement on the channels.

The high-order frequency measuring portion 2A includes a multiplexer 21, an amplifier 22, and an SAR (Successive Approximation Register) A/D converter 23.

The multiplexer 21 includes seven input terminals and one output terminal. The number of input terminals included in the multiplexer 21 is not limited to seven. According to the first embodiment, the number of input terminals included in the multiplexer 21 favorably equals the number of the electric power measuring portions 1A included in the semiconductor device 100A.

The multiplexer 21 uses the seven input terminals to receive analog signals output from the amplifier 11_1 through the amplifier 11_7 corresponding to the electric power measuring portion 1A_1 through the electric power measuring portion 1A_7, respectively. The multiplexer 21 sequentially selects analog signals received at the seven input terminals based on a switchover signal or a clock signal supplied from an unshown control portion, for example, and outputs the analog signals to the amplifier 22. Namely, the multiplexer 21 sequentially selects analog signals received from the amplifier 11_1 through the amplifier 11_7 and outputs the analog signals to the amplifier 22. The changeover by the multiplexer 21, namely, the sequential selection of received analog signals may be cyclic or acyclic.

The amplifier 22 provides a PGA whose gain is settled based on setup information supplied from an unshown control portion, for example. The amplifier 22 amplifies an analog signal received from the multiplexer 21 and outputs the analog signal to the SAR A/D converter 23.

The SAR A/D converter 23 operates on the 235-kHz second clock signal received from the clock controller 3A. The SAR A/D converter 23 uses the second clock signal to convert the analog signal received from the amplifier 22 into a digital signal. The SAR A/D converter 23 outputs the digital signal to the bus 4.

As above, the semiconductor device 100A according to the first embodiment is configured such that the electric power measuring portion 1A_1 through the electric power measuring portion 1A_7 include the delta-sigma A/D converter 12_1 through the delta-sigma A/D converter 12_7, respectively. The semiconductor device 100A is configured such that the high-order frequency measuring portion 2A includes the multiplexer 21 and the SAR A/D converter 23. The semiconductor device 100A can thereby allow the electric power measuring portion 1A_1 through the electric power measuring portion 1A_7 to perform the electric power measurement on different channels. In the semiconductor device 100A, the high-order frequency measuring portion 2A can use the multiplexer 21 for switchover to perform the high-order frequency measurement on the channels on which the electric power measuring portion 1A_1 through the electric power measuring portion 1A_7 perform the electric power measurement. Namely, the semiconductor device 100A can perform the high-order frequency measurement without greatly increasing consumption currents and chip die sizes because one high-order frequency measuring portion 2A can perform the high-order frequency measurement on each of the seven channels.

Second Embodiment

Figure 4:
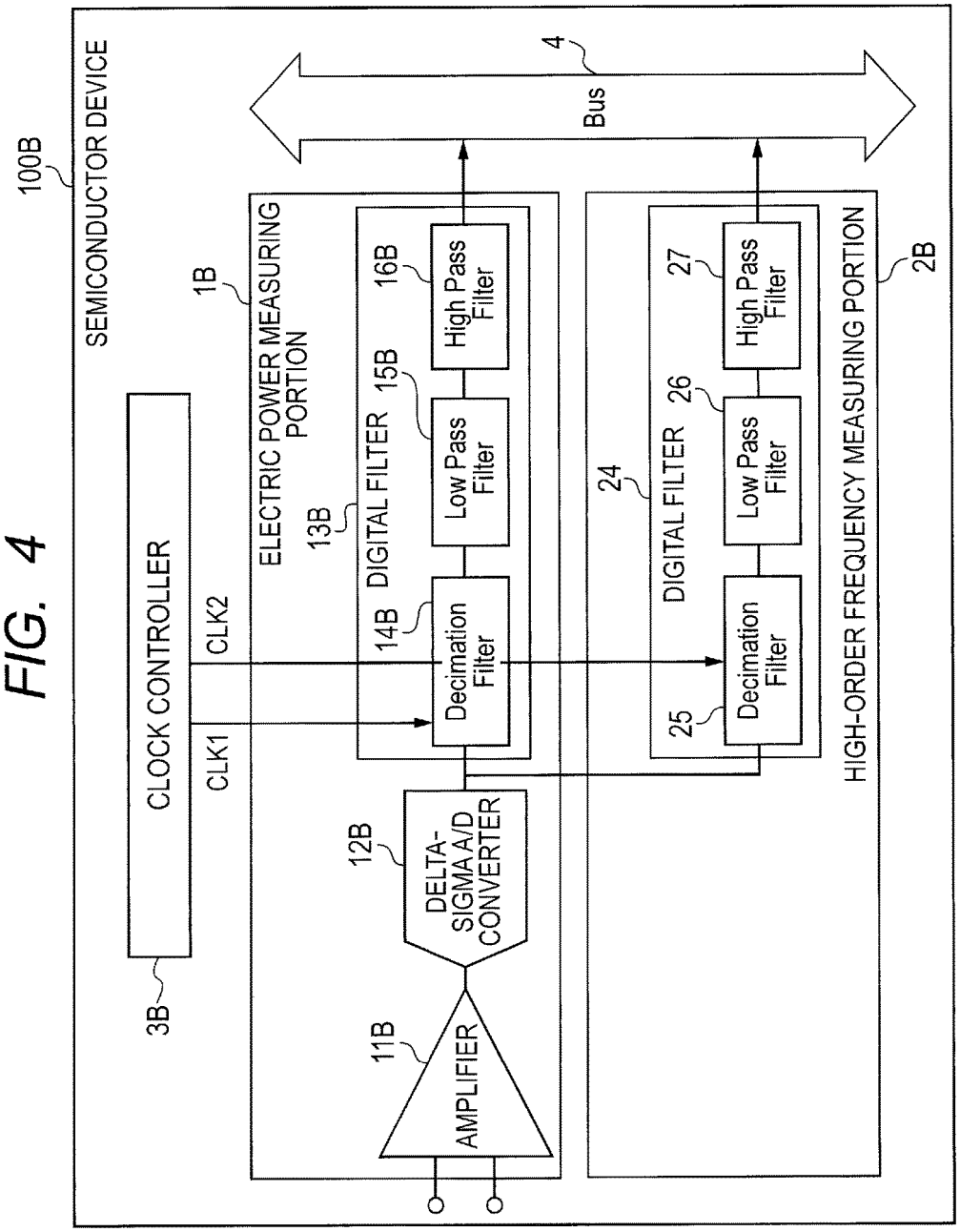
FIG. 4 is a block diagram illustrating an example configuration of a semiconductor device according to a second embodiment.

The second embodiment will be then described. FIG. 4 is a block diagram illustrating an example configuration of a semiconductor device 100B according to the second embodiment. The semiconductor device 100B includes an electric power measuring portion 1B, a high-order frequency measuring portion 2B, a clock controller 3B, and the bus 4

The electric power measuring portion 1B includes an amplifier 11B, a delta-sigma A/D converter 12B, and a digital filter 13B (first digital filter). The digital filter 13B includes a decimation filter 14B, a low-pass filter 15B, and a high-pass filter 16B. The amplifier 11B, the low-pass filter 15B, and the high-pass filter 16B are equal to the amplifier 11_1, the low-pass filter 15_1, and the high-pass filter 16_1, respectively, and a description is omitted.

The delta-sigma A/D converter 12B operates on a 1.5 MHz clock signal. The delta-sigma A/D converter 12B may receive the 1.5 MHz clock signal from the clock controller 3B, but not limited thereto. The delta-sigma A/D converter 12B uses the 1.5 MHz clock signal to convert the analog signal received from the amplifier 11B into a digital signal with a sampling frequency of 1.5 MHz. The delta-sigma A/D converter 12B outputs the digital signal with the sampling frequency of 1.5 MHz to the decimation filter 14B and the high-order frequency measuring portion 2B.

The decimation filter 14B operates on the 3.9 kHz first clock signal received from the clock controller 3B. The decimation filter 14B receives a digital signal with a sampling frequency of 1.5 MHz from the delta-sigma A/D converter 12B. The decimation filter 14B uses the first clock signal to perform decimation processing on the received digital signal. The sampling frequency of the digital signal thereby decreases from 1.5 MHz to 3.9 kHz. The decimation filter 14B outputs the digital signal with its sampling frequency decreased to 3.9 kHz to the low-pass filter 15B.

The high-order frequency measuring portion 2B will be described. The high-order frequency measuring portion 2B includes a digital filter 24 (second digital filter). The digital filter 24 includes a decimation filter 25, a low-pass filter 26, and a high-pass filter 27.

The decimation filter 25 operates on a 235 kHz second clock signal received from the clock controller 3B. The decimation filter 25 receives a digital signal with a sampling frequency of 1.5 MHz from the delta-sigma A/D converter 12B. The decimation filter 25 uses the second clock signal to perform decimation processing on the received digital signal. The sampling frequency of the digital signal thereby decreases from 1.5 MHz to 235 kHz. The decimation filter 25 outputs the digital signal with its sampling frequency decreased to 235 kHz to the low-pass filter 26.

The low-pass filter 26 performs low-pass filter processing on the digital signal received from the decimation filter 25 to suppress quantization noise in a high-frequency region. The low-pass filter 26 outputs the digital signal treated by the low-pass filter processing to the high-pass filter 27.

The high-pass filter 27 performs high-pass filter processing on the digital signal received from the low-pass filter 26 to suppress a signal in a low-frequency region. The high-pass filter 27 outputs the digital signal treated by the high-pass filter processing to the bus 4.

As above, the semiconductor device 100B according to the second embodiment uses the digital filter 24 to configure the high-order frequency measuring portion 2B. The semiconductor device 100B can therefore configure the high-order frequency measuring portion 2B by using a digital circuit only. For example, suppose the semiconductor device 100B is configured to include the seven electric power measuring portions 1B and the seven high-order frequency measuring portions 2B. In this case, the semiconductor device 100B can further decrease consumption currents and chip die sizes compared to the semiconductor device 100A according to the first embodiment.

First Modification of the Second Embodiment

The description below explains a semiconductor device 100C according to a first modification of the second embodiment. The first modification concerns a function that disables the digital filter 24 according to the second embodiment from performing the high-order frequency measurement when the high-order frequency measurement is unnecessary.

The semiconductor device 100C according to the first modification of the second embodiment includes the electric power measuring portion 1B, the high-order frequency measuring portion 2B, a clock controller 3C, and the bus 4. The configuration of the semiconductor device 100C differs from the configuration of the semiconductor device 100B according to the second embodiment only in that the clock controller 3C functions differently from the clock controller 3B. An illustration of the semiconductor device 100C is therefore omitted.

The clock controller 3C includes a function that disables the digital filter 24 from performing the high-order frequency measurement when the high-order frequency measurement is unnecessary. Specifically, the clock controller 3C provides control to disable the digital filter 24 when the high-order frequency measurement is unnecessary. Namely, the clock controller 3C stops supplying the second clock signal to the digital filter 24 when the high-order frequency measurement is unnecessary. The semiconductor device 100C can thereby further decrease consumption currents compared to the semiconductor device 100B according to the second embodiment.

There is required a specified time until the high-order frequency measurement, if performed, can start when the clock controller 3C stops supplying the second clock signal to the digital filter 24. When the high-order frequency measurement is unneeded, the clock controller 3C may therefore change the sampling frequency from 235 kHz to 3.9 kHz for the second clock signal to be supplied to the digital filter 24 instead of stopping the supply of the second clock signal to the digital filter 24. In this case, the semiconductor device 100C can further decrease consumption currents compared to the semiconductor device 100B according to the second embodiment and can shorten the time until the start of the high-order frequency measurement compared to the case of stopping the supply of the second clock signal to the digital filter 24 when the high-order frequency measurement is unneeded.

Figure 5:
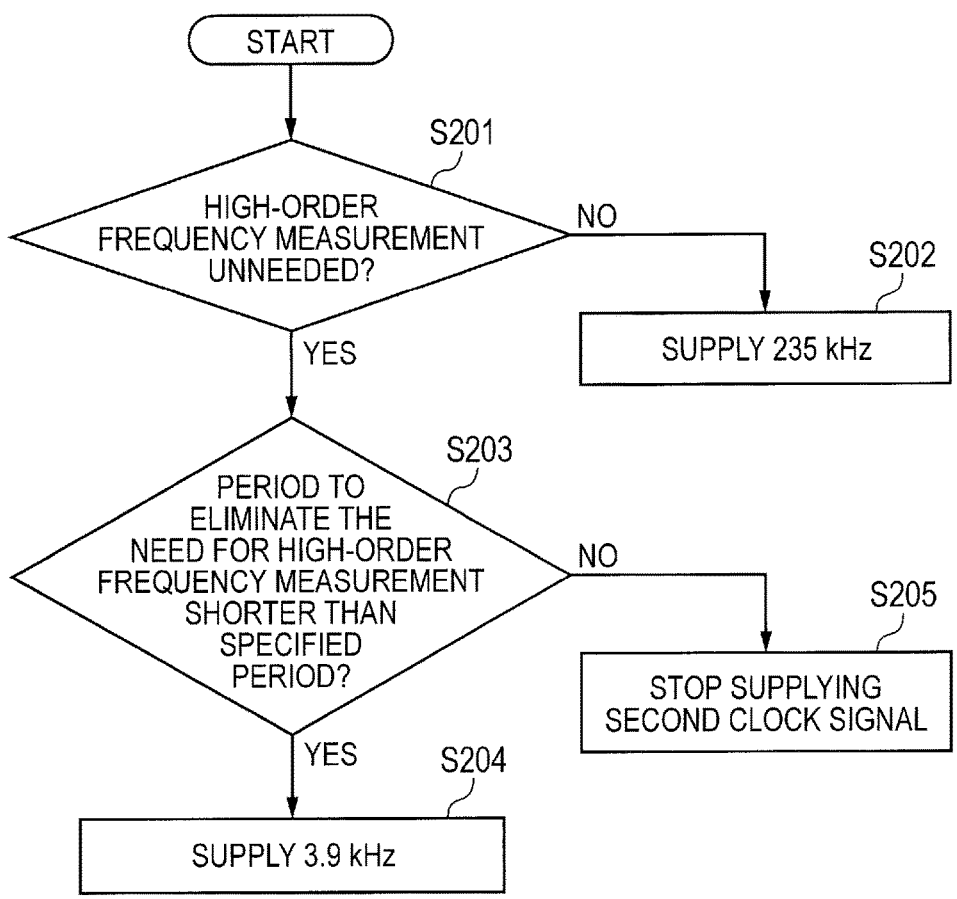
FIG. 5 is a flowchart illustrating example operation of a clock controller according to a first modification of the second embodiment.

The clock controller 3C may also perform a process concerning the high-order frequency measurement according to a flowchart in FIG. 5.

The description below explains the process concerning the high-order frequency measurement illustrated by the flowchart in FIG. 5. The clock controller 3C determines whether the high-order frequency measurement is unnecessary (step 201). The determination at step S201 is performed based on information supplied from an unshown control portion, for example.

The high-order frequency measurement may be necessary (NO at step S201). In this case, the sampling frequency of the second clock signal is set to 235 kHz and the second clock signal is supplied to the digital filter 24 (step S202).

The high-order frequency measurement may be unnecessary (YES at step S201). In this case, the process determines whether the period to eliminate the need for the high-order frequency measurement is shorter than a specified period (step S203). The specified period may be user-specifiable.

The period to eliminate the need for the high-order frequency measurement may be shorter than the specified period (YES at step S203). In this case, the sampling frequency of the second clock signal is set to 3.9 kHz and the second clock signal is supplied to the digital filter 24 (step S204).

The period to eliminate the need for the high-order frequency measurement may be longer than or equal to the specified period (NO at step S203). In this case, the process stops supplying the second clock signal to the digital filter 24 (step S205).

Suppose the clock controller 3C performs the process concerning the high-order frequency measurement according to the flowchart in FIG. 5. The semiconductor device 100C can then stop supplying the second clock signal when the period to eliminate the need for the high-order frequency measurement is longer than or equal to the specified period. The semiconductor device 100C can set the sampling frequency of the second clock signal to 3.9 kHz when the same period is shorter than the specified period. Namely, consumption currents can be efficiently decreased depending on the length of the period to eliminate the need for the high-order frequency measurement.

Second Modification of the Second Embodiment

The description below explains a semiconductor device 100D according to a second modification of the second embodiment. The second modification concerns the semiconductor device 100D that includes a plurality of the electric power measuring portions 1B according to the second embodiment and one high-order frequency measuring portion 2B according to the second embodiment.

Figure 6:
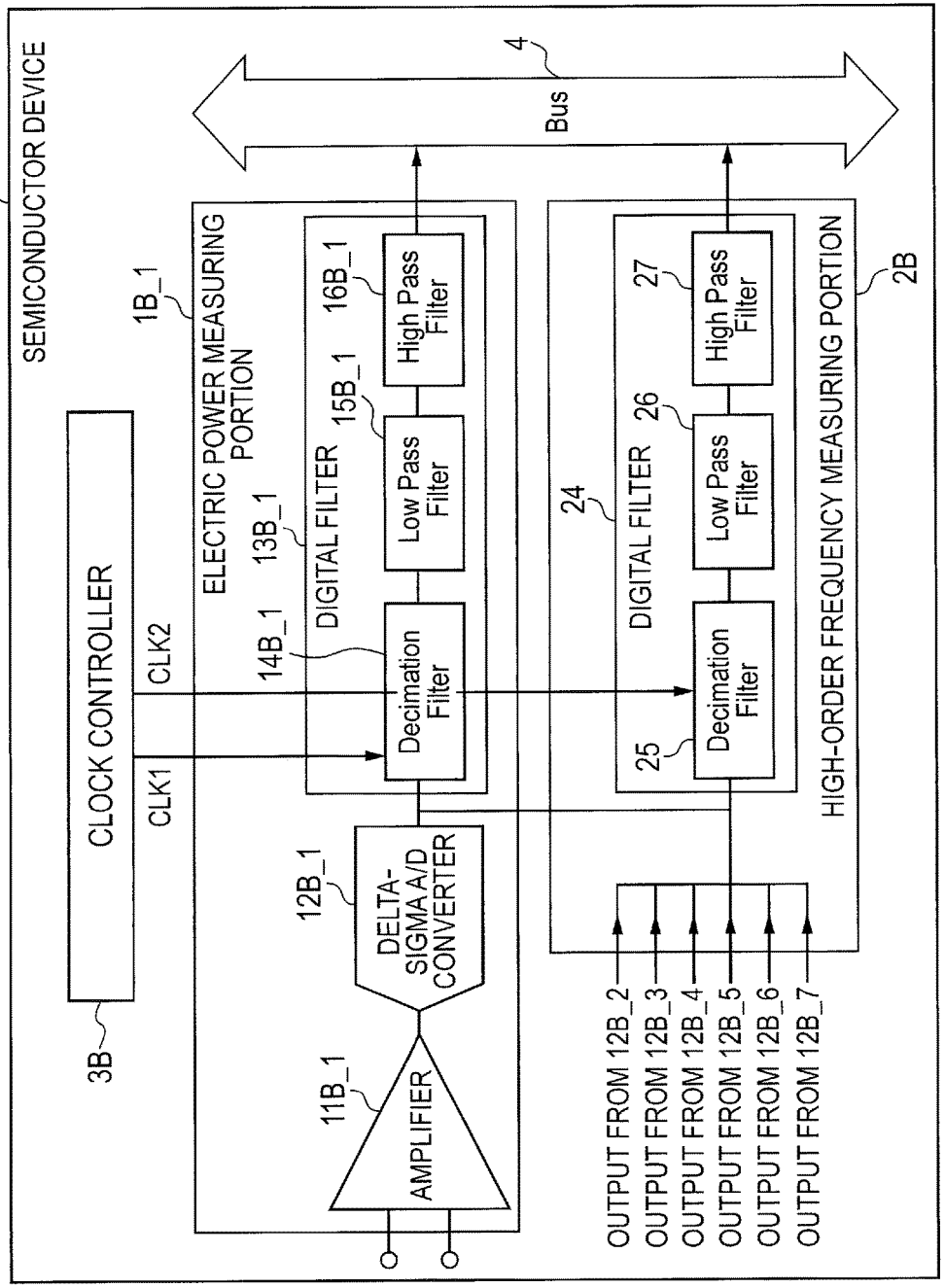
FIG. 6 is a block diagram illustrating an example configuration of a semiconductor device according to a second modification of the second embodiment.

FIG. 6 is a block diagram illustrating an example configuration of the semiconductor device 100D according to the second modification of the second embodiment. The semiconductor device 100D includes an electric power measuring portion 1B_1 through an electric power measuring portion 1B_7, the high-order frequency measuring portion 2B, the clock controller 3B, and the bus 4. The electric power measuring portion 1B_2 through the electric power measuring portion 1B_7 are configured equally to the electric power measuring portion 1B_1 and are omitted from the illustration. The semiconductor device 100D can perform electric power measurement on seven channels by using the electric power measuring portion 1B_1 through the electric power measuring portion 1B_7. The second modification explains the example of seven electric power measuring portions 1B (1B_1 through 1B_7) included in the semiconductor device 100D. However, the number of electric power measuring portions 1B included in the semiconductor device 100D is not limited to seven. The number of electric power measuring portions 1B included in the semiconductor device 100D may be two or any larger value.

An input terminal of the decimation filter 25 is coupled to output terminals of a delta-sigma A/D converter 12B_1 through a delta-sigma A/D converter 12B_7 corresponding to the electric power measuring portion 1B_1 through the electric power measuring portion 1B_7, respectively. The decimation filter 25 receives digital signals sequentially output from the delta-sigma A/D converter 12B_1 through the delta-sigma A/D converter 12B_7. Any technique may be used to sequentially output digital signals from the delta-sigma A/D converter 12B_1 through the delta-sigma A/D converter 12B_7. The sequential output of digital signals from the delta-sigma A/D converter 12B_1 through the delta-sigma A/D converter 12B_7 may be cyclic or acyclic.

The decimation filter 25 uses the second clock signal to perform decimation processing on digital signals sequentially received from the delta-sigma A/D converter 12B_1 through the delta-sigma A/D converter 12B_7. The semiconductor device 100D according to the second modification of the second embodiment can thereby allow one high-order frequency measuring portion 2B to perform the high-order frequency measurement on each of the seven channels. The semiconductor device 100D can further decrease consumption currents and chip die sizes compared to the configuration in which the semiconductor device 100B according to the second embodiment includes the seven electric power measuring portions 1B and the seven high-order frequency measuring portions 2B.

The semiconductor device 100D may include the clock controller 3C instead of the clock controller 3B. In this case, the semiconductor device 100D can disable the high-order frequency measurement using the digital filter 24 when the high-order frequency measurement is unneeded. Consumption currents can be further decreased.

Third Embodiment

Figure 7:
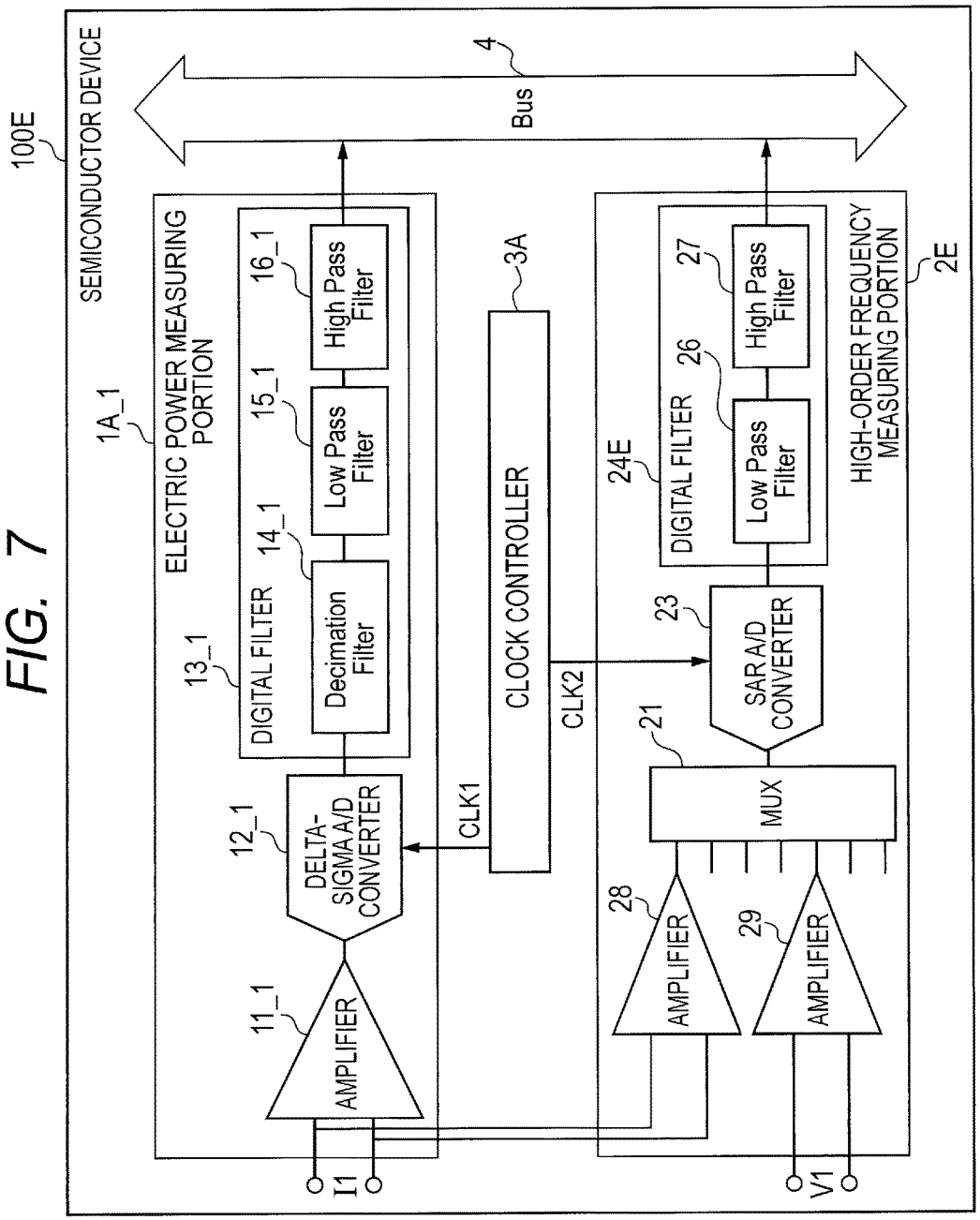
FIG. 7 is a block diagram illustrating an example configuration of a semiconductor device according to a third embodiment.

The description below explains a semiconductor device 100E according to the third embodiment. FIG. 7 is a block diagram illustrating an example configuration of the semiconductor device 100E according to the third embodiment. The semiconductor device 100E includes the electric power measuring portion 1A_1, a high-order frequency measuring portion 2E, the clock controller 3A, and the bus 4. The semiconductor device 100E is configured such that the electric power measuring portion 1A_1 can perform electric power measurement and the high-order frequency measuring portion 2E can perform voltage measurement and high-order frequency measurement.

The electric power measuring portion 1A_1 performs current measurement on a current signal (I1) for the first channel while the current signal is input to the non-inverted input terminal and the inverted input terminal of the amplifier 11_1 (first amplifier).

The high-order frequency measuring portion 2E includes an amplifier 28 (second amplifier), an amplifier 29 (third amplifier), the multiplexer 21, the SAR A/D converter 23, and a digital filter 24E. The digital filter 24E includes the low-pass filter 26 and the high-pass filter 27.

The amplifier 28 provides a PGA whose gain is settled based on setup information supplied from an unshown control portion, for example. A non-inverted input terminal of the amplifier 28 is coupled to a non-inverted input terminal of the amplifier 11_1. An inverted input terminal of the amplifier 28 is coupled to an inverted input terminal of the amplifier 11_1. Namely, the input terminal of the amplifier 28 is coupled to the input terminal of the amplifier 11_1.

The amplifier 28 therefore receives a signal same as a signal input to the amplifier 11_1. Namely, the amplifier 28 receives a current signal for the first channel and amplifies the current signal that is to be input to the amplifier 11_1. The amplifier 28 outputs the amplified current signal for the first channel to the multiplexer 21.

The amplifier 29 provides a PGA whose gain is settled based on setup information supplied from an unshown control portion, for example. The amplifier 29 receives a voltage signal (V1) for the first channel at the non-inverted input terminal and the inverted input terminal. The amplifier 29 amplifies the received voltage signal (V1) for the first channel and outputs the voltage signal to the multiplexer 21.

An output terminal of the amplifier 28 and an output terminal of the amplifier 29 are each coupled to different input terminals of the multiplexer 21.

The multiplexer 21 receives analog signals output from the amplifier 28 and the amplifier 29. Namely, the multiplexer 21 receives the current signal for the first channel output from the amplifier 28 and the voltage signal for the first channel output from the amplifier 29. The multiplexer 21 sequentially selects the received current signal for the first channel and the received voltage signal for the first channel based on a switchover signal or a clock signal supplied from an unshown control portion, for example, and outputs the signals to the SAR A/D converter 23. The changeover by the multiplexer 21, namely, the sequential selection of the received current signal for the first channel and the received voltage signal for the first channel may be cyclic or acyclic.

The SAR A/D converter 23 uses the second clock signal to convert the analog signal received from the amplifier 22 into a digital signal. Namely, the SAR A/D converter 23 uses the second clock signal to convert the current signal for the first channel and the voltage signal for the first channel into digital signals. The SAR A/D converter 23 outputs the digitals signals to the low-pass filter 26.

The low-pass filter 26 performs low-pass filter processing on the digital signal received from the SAR A/D converter 23 to suppress quantization noise in a high-frequency region. The low-pass filter 26 outputs the digital signal treated by the low-pass filter processing to the high-pass filter 27.

The high-pass filter 27 performs high-pass filter processing on the digital signal received from the low-pass filter 26 to suppress a signal in a low-frequency region. The high-pass filter 27 outputs the digital signal treated by the high-pass filter processing to the bus 4.

As above, the semiconductor device 100E according to the third embodiment is configured such that the input terminal of the amplifier 28 is coupled to the input terminal of the amplifier 11_1. The semiconductor device 100E is configured such that a current signal is input to the input terminal of the amplifier 11_1 and a voltage signal is input to the input terminal of the amplifier 29. The semiconductor device 100E is further configured such that the multiplexer 21 receives output signals from the amplifier 28 and the amplifier 29, sequentially selects the output signals, and outputs them to the SAR A/D converter 23. The semiconductor device 100E can thereby allow the electric power measuring portion 1A_1 to perform the current measurement on current signals. In the semiconductor device 100E, the high-order frequency measuring portion 2E can use the multiplexer 21 for switchover to perform the high-order frequency measurement on current signals and perform the voltage measurement on voltage signals and the high-order frequency measurement on voltage signals. Specifically, the semiconductor device 100E can perform the high-order frequency measurement on current signals for the first channel when the multiplexer 21 selects an output signal from the amplifier 28 and outputs the signal to the SAR A/D converter 23. The semiconductor device 100E can perform the voltage measurement on voltage signals for the first channel and the high-order frequency measurement on voltage signals for the first channel when the multiplexer 21 selects an output signal from the amplifier 29 and outputs the signal to the SAR A/D converter 23.

The semiconductor device 100E according to the above-mentioned configuration can decrease noise interference between the delta-sigma A/D converter 12_1 and the SAR A/D converter 23 compared to the semiconductor device 100A according to the first embodiment.

Modification of the Third Embodiment

The description below explains a semiconductor device 100F according to a modification of the third embodiment. The modification concerns the semiconductor device 100F that includes a plurality of the electric power measuring portions 1A according to the third embodiment and one high-order frequency measuring portion 2F.

The semiconductor device 100F includes the electric power measuring portion 1A_1 through the electric power measuring portion 1A_4, the high-order frequency measuring portion 2F, the clock controller 3A, and the bus 4. The electric power measuring portion 1A_2 through the electric power measuring portion 1A_4 are configured equally to the electric power measuring portion 1A_1 and are omitted from the explanation. The number of the electric power measuring portions 1A included in the semiconductor device 100F is not limited to four.

The semiconductor device 100F can measure a three-phase four-wire AC power supply, for example. In this case, the electric power measuring portion 1A_1 through the electric power measuring portion 1A_4 perform the current measurement on current signals (I1 through I4) for the four channels. Namely, the electric power measuring portion 1A_1 through the electric power measuring portion 1A_4 can perform the 4-wire current measurement. The high-order frequency measuring portion 2F performs the voltage measurement on voltage signals (V1 through V3) for the three channels and performs the high-order frequency measurement on the seven channels. Namely, the high-order frequency measuring portion 2F can perform the three-phase voltage measurement and the three-phase four-wire high-order frequency measurement.

Figure 8:
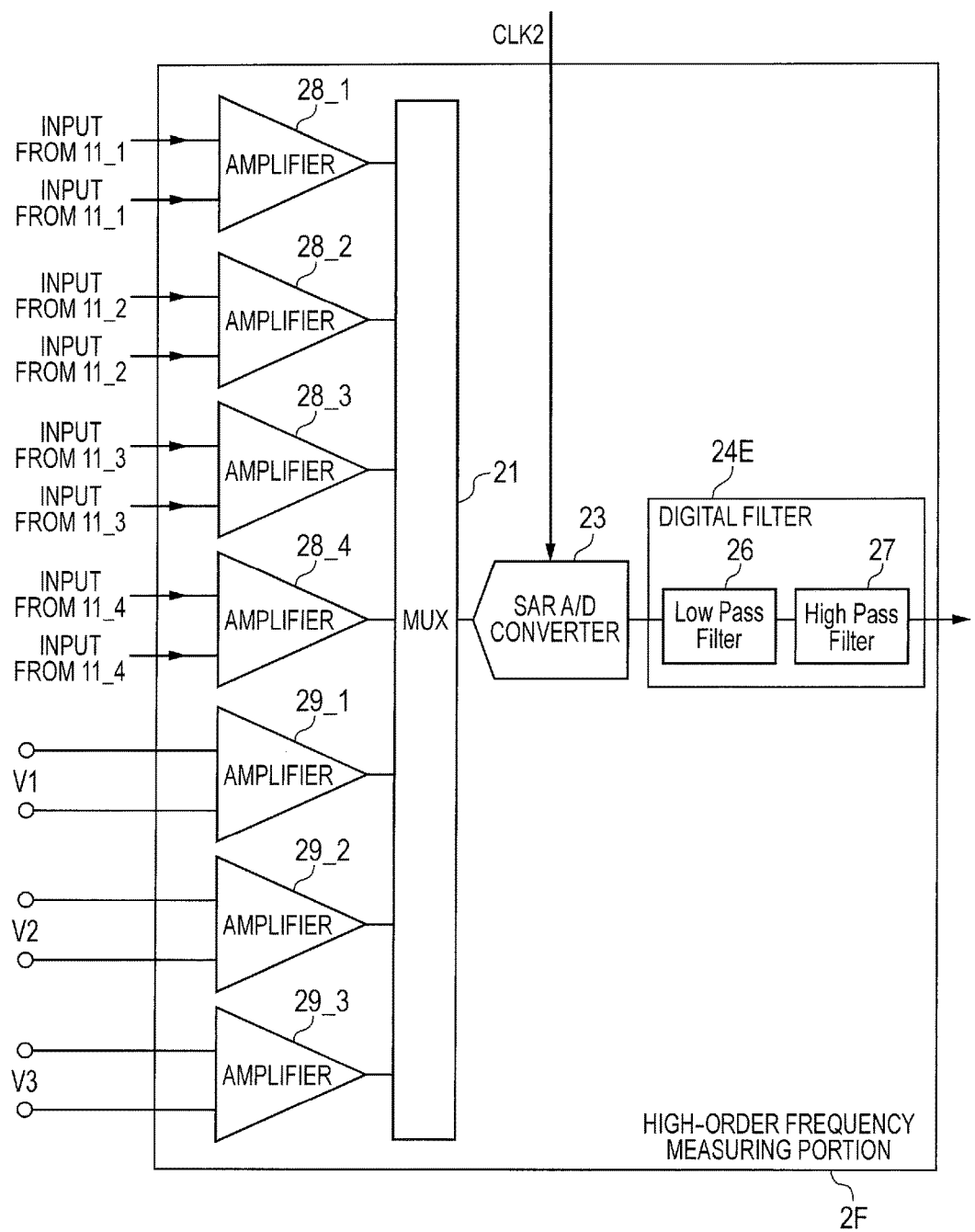
FIG. 8 is a block diagram illustrating an example configuration of a high-order frequency measuring portion of a semiconductor device according to a modification of the third embodiment.

FIG. 8 is a block diagram illustrating an example configuration of a high-order frequency measuring portion 2F of the semiconductor device 100F. The high-order frequency measuring portion 2F includes an amplifier 28_1 through an amplifier 28_4, an amplifier 29_1 through an amplifier 29_3, the multiplexer 21, the SAR A/D converter 23, and the digital filter 24E.

Non-inverted input terminals of the amplifier 28_1 through the amplifier 28_4 are coupled to non-inverted input terminals of the corresponding amplifiers 11. Namely, the non-inverted input terminal of the amplifier 28_1 is coupled to the non-inverted input terminal of the amplifier 11_1. The non-inverted input terminal of the amplifier 28_2 is coupled to the non-inverted input terminal of the amplifier 11_2. The non-inverted input terminal of the amplifier 28_3 is coupled to the non-inverted input terminal of the amplifier 11_3. The non-inverted input terminal of the amplifier 28_4 is coupled to the non-inverted input terminal of the amplifier 11_4.

Inverted input terminals of the amplifier 28_1 through the amplifier 28_4 are coupled to inverted input terminals of the corresponding amplifiers 11.

The amplifier 28_1 through the amplifier 28_4 amplify the current signals (I1 through I4) for the corresponding channels and outputs the amplified current signals to the multiplexer 21.

The amplifier 29_1 through the amplifier 29_3 amplify the voltage signals (V1 through V3) for the corresponding channels and outputs the amplified voltage signals to the multiplexer 21.

The multiplexer uses seven input terminals to receive analog signals output from the amplifier 28_1 through the amplifier 28_4 and the amplifier 29_1 through the amplifier 29_3. The multiplexer 21 sequentially selects the received analog signals based on a switchover signal or a clock signal supplied from an unshown control portion, for example, and outputs the signals to the SAR A/D converter 23. Namely, the multiplexer 21 sequentially selects analog signals received from the amplifier 28_1 through the amplifier 28_4 and the amplifier 29_1 through the amplifier 29_3 and outputs the analog signals to the SAR A/D converter 23. The changeover by the multiplexer 21, namely, the sequential selection of received analog signals may be cyclic or acyclic.

Processes by the SAR A/D converter 23, the low-pass filter 26, and the high-pass filter 27 are equal to those on the semiconductor device 100E according to the third embodiment and a description is omitted.

As above, the semiconductor device 100F according to the modification of the third embodiment is configured to include the electric power measuring portion 1A_1 through the electric power measuring portion 1A_4. In the semiconductor device 100F, the high-order frequency measuring portion 2F is configured to include the amplifier 28_1 through the amplifier 28_4, the amplifier 29_1 through the amplifier 29_3, the multiplexer 21, and the SAR A/D converter 23. The semiconductor device 100F can therefore allow the electric power measuring portion 1A_1 through the electric power measuring portion 1A_4 to perform the current measurement on current signals for the four channels. In the semiconductor device 100F, the high-order frequency measuring portion 2F can use the multiplexer 21 for switchover to perform the high-order frequency measurement on current signals for the four channels, perform the voltage measurement on voltage signals for the three channels, and perform the high-order frequency measurement on voltage signals for the three channels. Further, the semiconductor device 100F includes fewer delta-sigma A/D converters than the semiconductor device 100A according to the first embodiment and can therefore further decrease consumption currents and chip die sizes than the semiconductor device 100A.

While there has been described the specific embodiments of the invention made by the inventors, it is to be distinctly understood that the present invention is not limited to the above-mentioned embodiments and may be embodied in various modifications without departing from the spirit and scope of the invention.

What is claimed is:

1. A semiconductor device comprising:
   an electric power measuring portion that performs electric power measurement;
   a high-order frequency measuring portion that performs high-order frequency measurement; and
   a clock controller that supplies the electric power measuring portion with a first clock signal at a first sampling frequency and supplies the high-order frequency measuring portion with a second clock signal at a second sampling frequency,
wherein the second sampling frequency is higher than the first sampling frequency.

2. The semiconductor device according to claim 1,
wherein the electric power measuring portion includes a delta-sigma A/D converter;
wherein the high-order frequency measuring portion includes an SAR (Successive Approximation Register) A/D converter; and
wherein the clock controller supplies the first clock signal to the delta-sigma A/D converter and supplies the second clock signal to the SAR A/D converter.

3. The semiconductor device according to claim 2, comprising:
a plurality of the electric power measuring portions,
wherein the high-order frequency measuring portion further includes a multiplexer,
wherein the electric power measuring portions perform electric power measurement on different channels, and
wherein the high-order frequency measuring portion uses the multiplexer to perform high-order frequency measurement on each channel on which the electric power measuring portions perform electric power measurement.

4. The semiconductor device according to claim 2,
wherein the electric power measuring portion further includes a first amplifier,
wherein an output terminal of the first amplifier is coupled to an input terminal of the delta-sigma A/D converter and is configured to perform current measurement on a current signal supplied to an input terminal of the first amplifier,
wherein the high-order frequency measuring portion further includes:
a second amplifier;
a third amplifier; and a multiplexer;
wherein an input terminal of the second amplifier is coupled to the input terminal of the first amplifier,
wherein an output terminal of the second amplifier and an output terminal of the third amplifier are coupled to different input terminals of the multiplexer,
wherein an output terminal of the multiplexer is coupled to an input terminal of the SAR A/D converter, and
wherein the high-order frequency measuring portion is configured to use the multiplexer to perform high-order frequency measurement on a current signal supplied to the input terminal of the second amplifier, perform voltage measurement on a voltage signal supplied to an input terminal of the third amplifier, and perform high-order frequency measurement on the voltage signal.

5. The semiconductor device according to claim 4, comprising:
a plurality of the electric power measuring portions,
wherein the high-order frequency measuring portion includes a plurality of the second amplifiers and a plurality of the third amplifiers,
wherein the electric power measuring portions perform current measurement on a current signal for different channels, and
wherein the high-order frequency measuring portion uses the multiplexer to perform high-order frequency measurement on the current signal for each channel, perform voltage measurement on voltage signals for different channels supplied to input terminals of the third amplifiers, and perform the high-order frequency measurement on the voltage signal for each channel.

6. The semiconductor device according to claim 5,
wherein the number of electric power measuring portions is four,
wherein the number of the second amplifiers is four, and
wherein the number of the third amplifiers is three.

7. The semiconductor device according to claim 1,
wherein the electric power measuring portion includes a delta-sigma A/D converter and a first digital filter;
wherein the high-order frequency measuring portion includes a second digital filter, and
wherein the clock controller supplies the first clock signal to the first digital filter and supplies the second clock signal to the second digital filter.

8. The semiconductor device according to claim 7,
wherein, when high-order frequency measurement is unneeded, the clock controller disables high-order frequency measurement using the second digital filter.

9. The semiconductor device according to claim 8,
wherein disabling high-order frequency measurement using the second digital filter signifies changing a sampling frequency of the second clock signal to be supplied to the second digital filter to the first sampling frequency.

10. The semiconductor device according to claim 8,
wherein disabling high-order frequency measurement using the second digital filter signifies stopping supplying the second clock signal to the second digital filter.

11. The semiconductor device according to claim 8,
wherein disabling high-order frequency measurement using the second digital filter signifies
changing a sampling frequency of the second clock signal to be supplied to the second digital filter to the first sampling frequency when a period to eliminate the need for high-order frequency measurement is shorter than a specified period and
stopping supplying the second clock signal to the second digital filter when a period to eliminate the need for high-order frequency measurement is longer than or equal to the specified period.

12. The semiconductor device according to claim 7, comprising:
a plurality of the electric power measuring portions,
wherein the electric power measuring portions perform electric power measurement on different channels, and
wherein the high-order frequency measuring portion performs high-order frequency measurement on each channel on which the electric power measuring portions perform electric power measurement.

13. A measuring method comprising the steps of:
setting a second sampling frequency of a second clock signal to be higher than a first sampling frequency of a first clock signal; and
performing electric power measurement using the first clock signal and performing high-order frequency measurement using the second clock signal.

14. The measuring method according to claim 13,
wherein the electric power measurement is performed by supplying the first clock signal to a delta-sigma A/D converter, and
wherein the high-order frequency measurement is performed by supplying the second clock signal to an SAR (Successive Approximation Register) A/D converter.

15. The measuring method according to claim 14,
wherein the electric power measurement is performed on different channels by using the delta-sigma A/D converters, and
wherein the high-order frequency measurement is performed on different channels by using a multiplexer and by using the one SAR A/D converter.

16. The measuring method according to claim 13,
wherein the electric power measurement is performed by supplying the first clock signal to a first digital filter, and
wherein the high-order frequency measurement is performed by supplying the second clock signal to a second digital filter.

17. The measuring method according to claim 16,
wherein high-order frequency measurement using the second digital filter is disabled when high-order frequency measurement is unneeded.

18. The measuring method according to claim 17,
wherein disabling high-order frequency measurement using the second digital filter signifies changing a sampling frequency of the second clock signal to be supplied to the second digital filter to the first sampling frequency.

19. The measuring method according to claim 17,
wherein disabling high-order frequency measurement using the second digital filter signifies stopping supplying the second clock signal to the second digital filter.

20. The measuring method according to claim 17,
wherein disabling high-order frequency measurement using the second digital filter signifies
changing a sampling frequency of the second clock signal to be supplied to the second digital filter to the first sampling frequency when a period to eliminate the need for high-order frequency measurement is shorter than a specified period, and
stopping supplying the second clock signal to the second digital filter when a period to eliminate the need for high-order frequency measurement is longer than or equal to the specified period.

* * * * *